US009876098B2

(12) United States Patent
Huang

(10) Patent No.: US 9,876,098 B2
(45) Date of Patent: Jan. 23, 2018

(54) METHOD OF FORMING A GATE SPACER

(71) Applicant: Taiwan Semiconductor Manufacturing Co., Ltd., Hsin-Chu (TW)

(72) Inventor: Yu-Lien Huang, Hsinchu County (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/996,843

(22) Filed: Jan. 15, 2016

(65) Prior Publication Data
US 2017/0207324 A1    Jul. 20, 2017

(51) Int. Cl.
*H01L 29/66* (2006.01)
*H01L 29/423* (2006.01)

(52) U.S. Cl.
CPC .. *H01L 29/66803* (2013.01); *H01L 29/66795* (2013.01); *H01L 29/4232* (2013.01); *H01L 29/6653* (2013.01); *H01L 29/6656* (2013.01)

(58) Field of Classification Search
CPC ......... H01L 21/02126; H01L 21/02164; H01L 21/02274; H01L 21/02307; H01L 29/4232; H01L 21/823468; H01L 29/66795; H01L 29/6653; H01L 29/6656; H01L 29/785; H01L 29/41783; H01L 29/66628; H01L 29/6772; H01L 21/84
See application file for complete search history.

(56) References Cited

U.S. PATENT DOCUMENTS

| | | | |
|---|---|---|---|
| 7,425,740 B2 | 9/2008 | Liu et al. | |
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2011/0101455 A1* | 5/2011 | Basker | H01L 21/26586 257/347 |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2015/0162190 A1* | 6/2015 | Posseme | H01L 21/02126 257/288 |

* cited by examiner

*Primary Examiner* — Thanh T Nguyen
(74) *Attorney, Agent, or Firm* — Haynes and Boone, LLP

(57) ABSTRACT

A method of fabricating a semiconductor device includes forming a fin feature over a substrate having a first region and a second region, forming a gate stack over the fin feature in the first region and forming a spacer layer over the gate stack in the first region and over the fin feature in the second region. The spacer layer is disposed along sidewalls of the gate stack and the fin feature, respectively. The method also includes removing the spacer layer along sidewalls of the fin feature in the second region without removing the spacer layer along sidewalls of the gate stack in the first region.

20 Claims, 23 Drawing Sheets

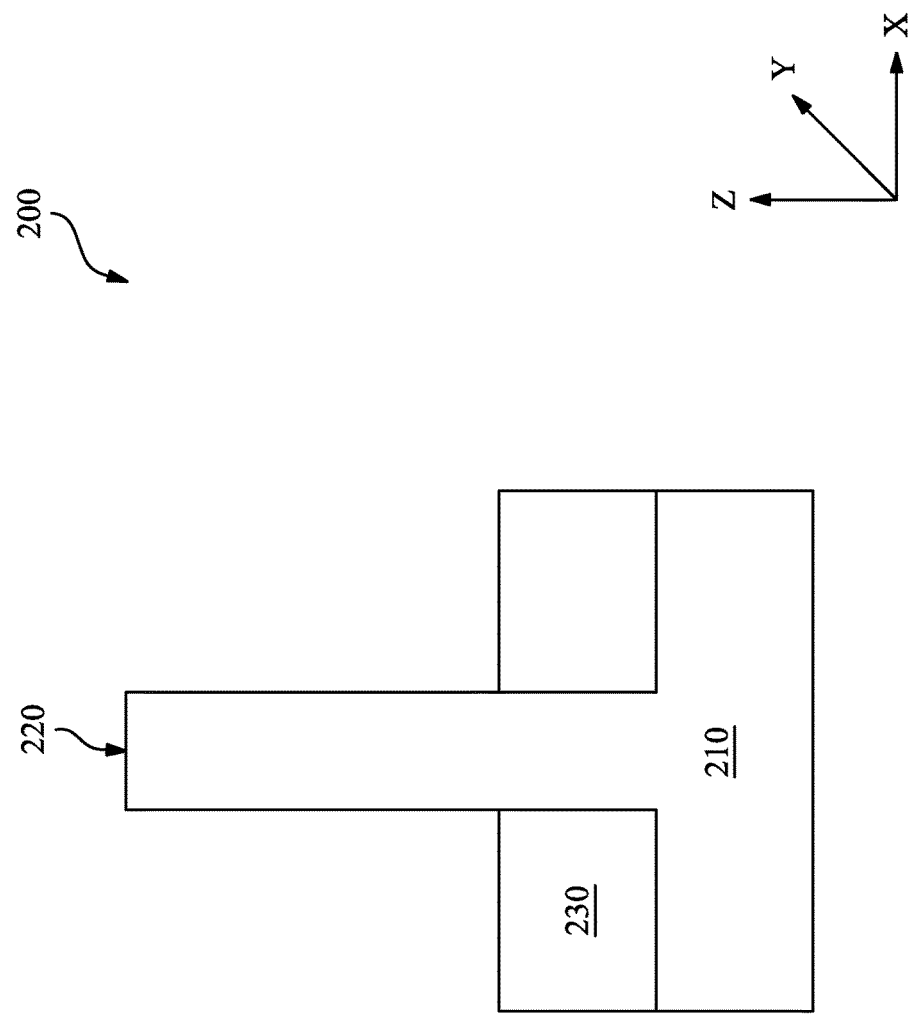

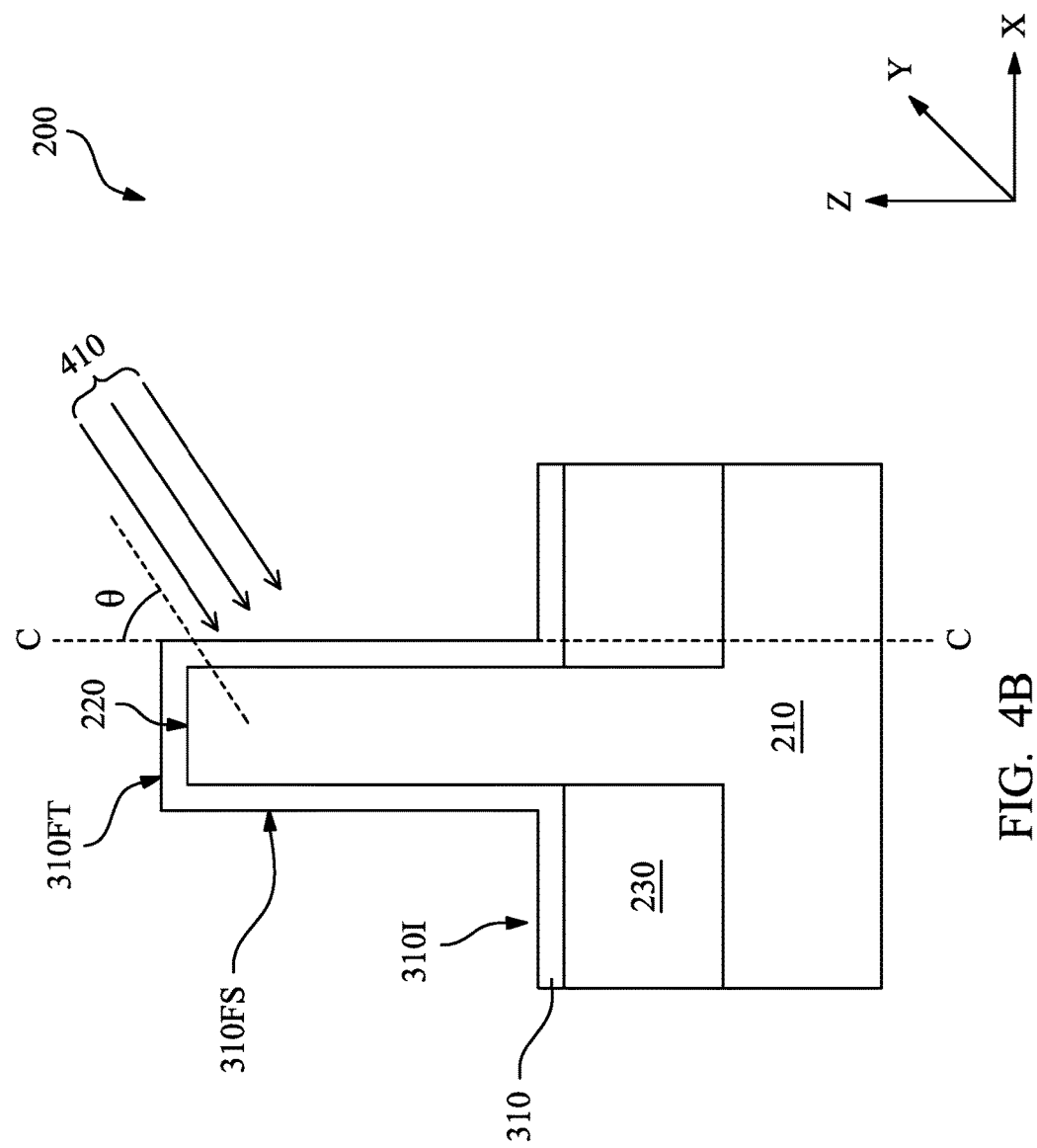

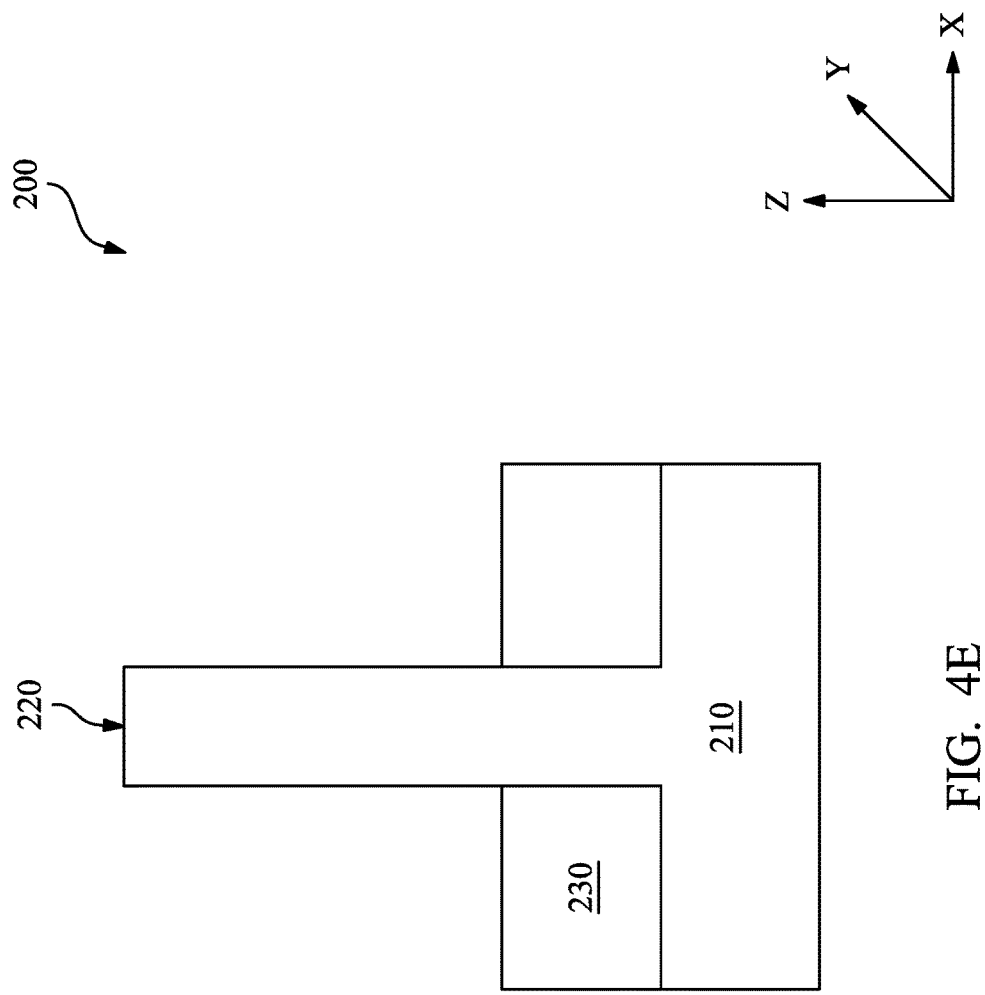

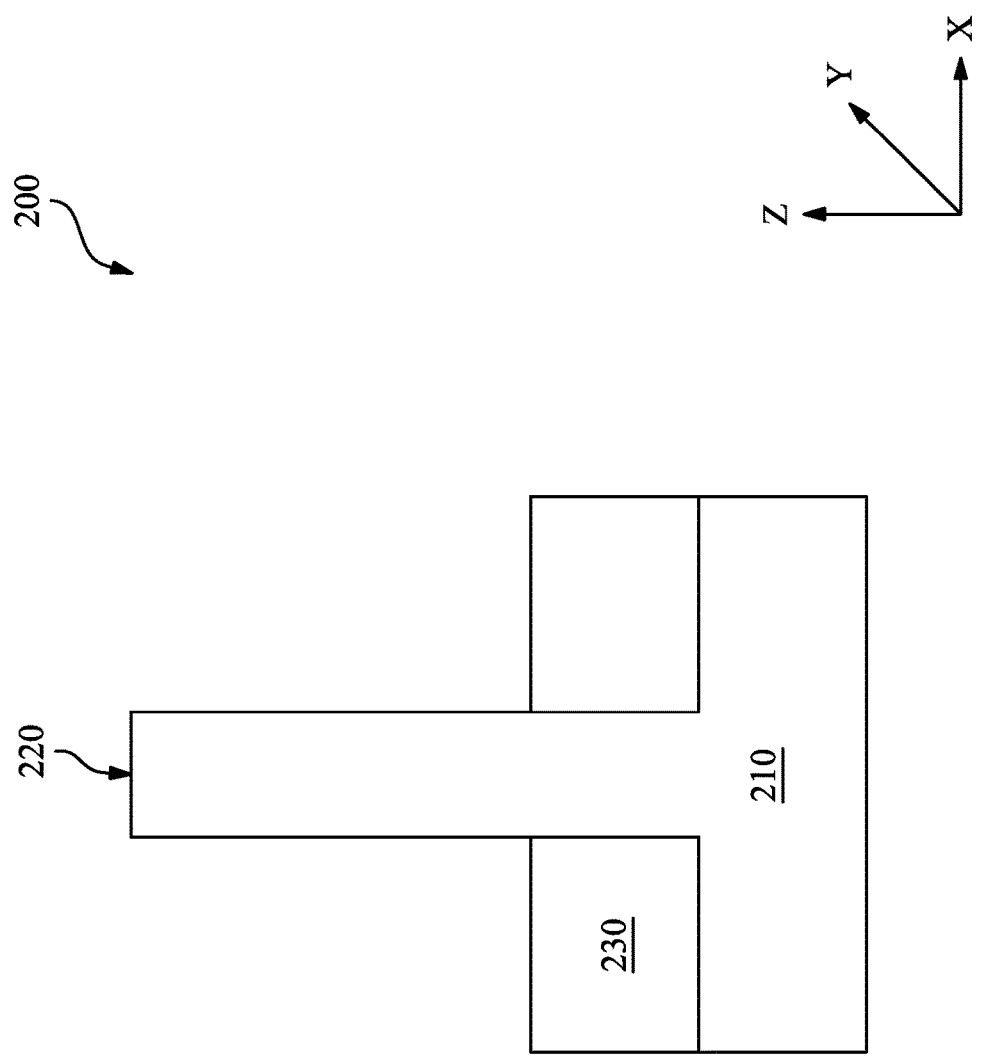

METHOD OF FORMING A GATE SPACER

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, improvements in the process of forming of a gate spacer in a FinFET device are desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 2B is a cross section view of an example of the initial structure in accordance with some embodiments, along the line A-A in FIG. 2A.

FIGS. 4B, 4C, 4D and 4E are cross section views of an example device in accordance with some embodiments, along the line A-A in FIG. 4A.

FIG. 7A is a cross section view of an example device in accordance with some embodiments, along the line A-A in FIG. 6A.

DETAILED DESCRIPTION

Figure 1:
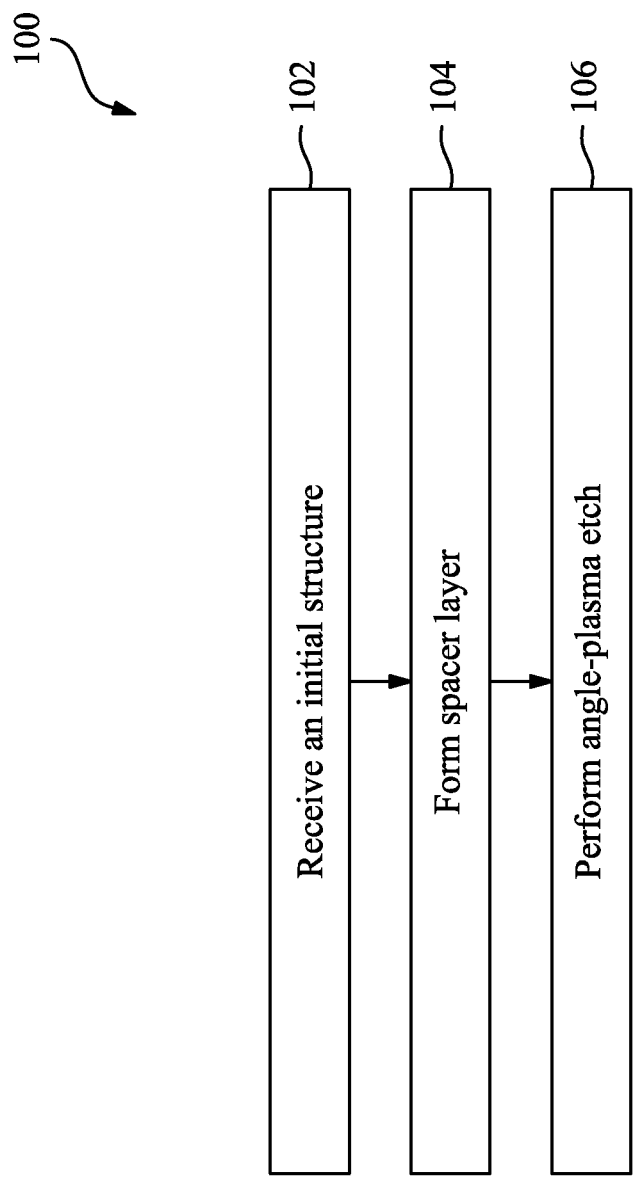
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
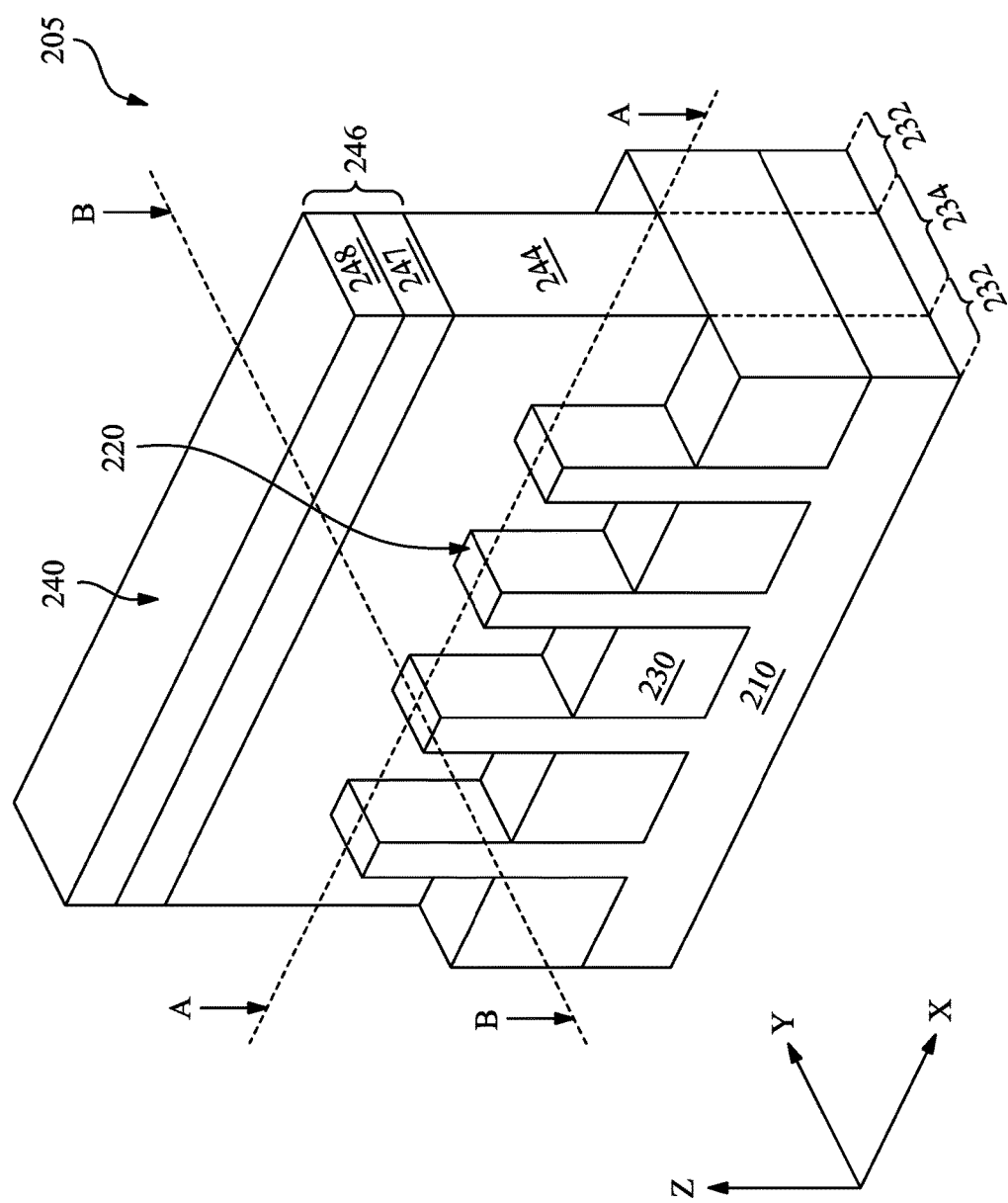
FIG. 2A is a diagrammatic perspective view of an initial structure of an example semiconductor device in accordance with some embodiments.
Figure 2C:
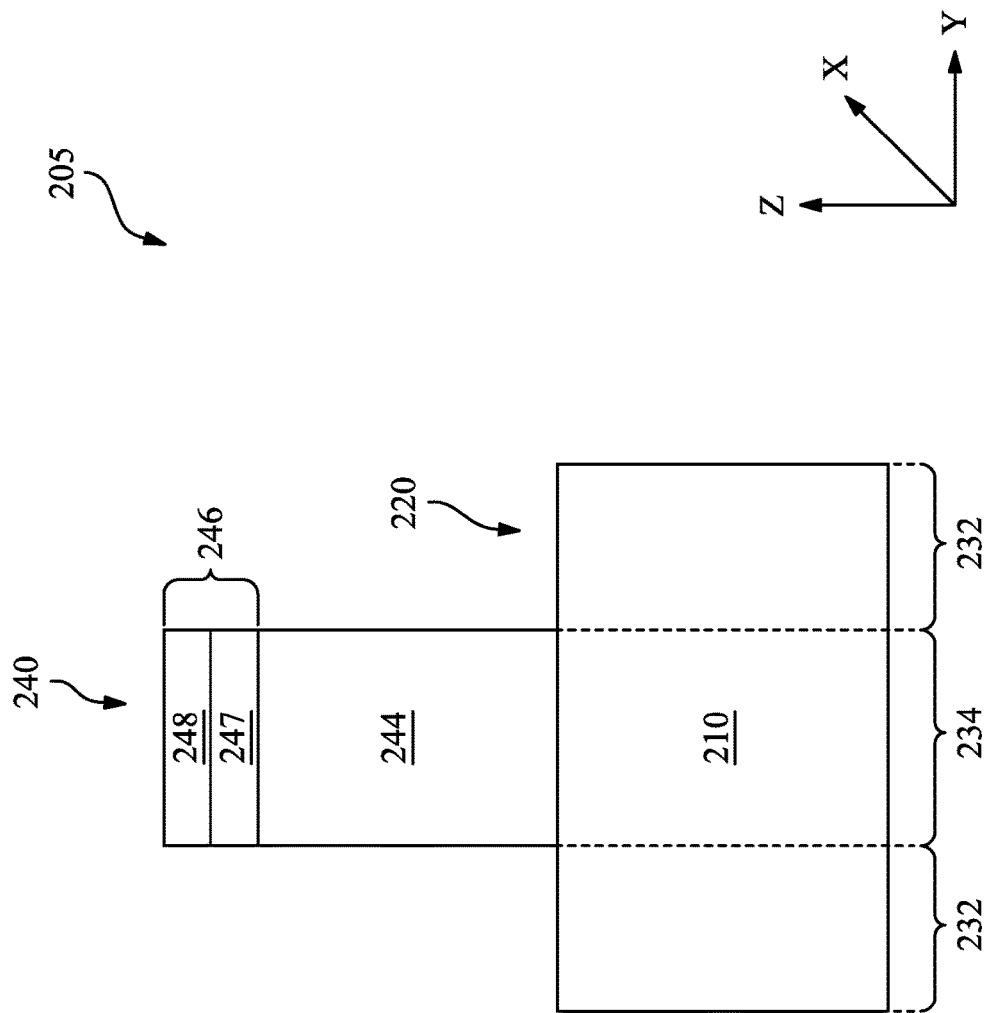
FIG. 2C is a cross section view of an example of the initial structure in accordance with some embodiments, along the line B-B in FIG. 2A.

FIG. 1 is a flowchart of a method 100 of fabricating one or more semiconductor device in accordance with some embodiments. The method 100 is discussed in detail below, with reference to an initial structure 205 of a semiconductor device 200 shown in FIGS. 2A, 2B and 2C and the semiconductor device 200 shown in FIGS. 3A through 4G. The device 200 may be an integrated circuit (IC), or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and/or combinations thereof. The device 200 may include three-dimensional devices and multi-gate devices such as double gate FETs, FinFETs, tri-gate FETs, omega FETs, and gate-all-around (GAA) devices including vertical GAA devices and horizontal GAA devices.

Referring to FIGS. 1, 2A, 2B and 2C, the method 100 begins at step 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary initial structure 205, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; and/or combinations thereof. The doped regions may be formed directly on the substrate 210, in a P-well structure, in an N-well structure, in a dual-well structure, and/or using a raised structure. The substrate 210 may further include various active regions, such as regions configured for an N-type metal-oxide-semiconductor transistor device and regions configured for a P-type metal-oxide-semiconductor transistor device.

The initial structure 205 also includes a plurality of fin features 220 formed over the substrate 210. The fin features 220 are formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. The area not protected by the masking element is etched using reactive ion etching (RIE) processes and/or other suitable processes. In an example, the fin features 220 are formed by patterning and etching a portion of the silicon substrate 210. In another example, the fin features 220 are formed by patterning and etching a silicon layer deposited overlying an insulator layer (for example, an upper silicon layer of a silicon-insulator-silicon stack of an SOI substrate.

The initial structure 205 may also include various isolation features 230. The isolation features 230 separate various device regions in the substrate 210. The isolation features 230 include different structures formed by using different processing technologies. For example, the isolation features 230 may include shallow trench isolation (STI) features. The formation of a STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 230.

In some embodiments, the substrate 210 has source/drain (S/D) regions 232 and a gate region 234. In some embodiments, a S/D region 232 is a source region, and another S/D region 232 is a drain region. The S/D regions 232 are separated by the gate region 234.

The initial structure 205 also includes one or more gate stacks 240 formed over gate region 234 in the substrate 210, including wrapping over a portion of the fin features 220. In some embodiments, the gate stack 240 is a dummy (sacrificial) gate stack and will be replaced by the final gate stack at a subsequent processing stage of the device 200. In particular, the dummy gate stack 240 may be replaced at a later processing stage by a high-K dielectric layer (HK) and metal gate electrode (MG). In some embodiments, the dummy gate stack 240 includes the dummy dielectric layer 242, an electrode layer 244, and a gate hard mask 246 which may include multiple layers 247 and 248 (e.g., an oxide layer 247 and a nitride layer 248). In some embodiments, the dummy dielectric layer 242 is not included in the dummy gate stack 240, for example, being removed prior to the deposition of the dummy gate stack 240. In some embodiments, an additional dummy gate dielectric layer is included in the gate stack in addition or in lieu of dummy dielectric layer 242.

In some embodiments, the dummy gate stack 240 is formed by various process steps such as layer deposition, patterning, etching, as well as other suitable processing steps. Exemplary layer deposition processes includes chemical vapor deposition (CVD), including both low-pressure CVD and plasma-enhanced CVD, physical vapor deposition (PVD), atomic layer deposition (ALD), thermal oxidation, e-beam evaporation, and/or other suitable deposition techniques, or combinations thereof. In forming the dummy gate stack 240 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the dummy gate stack 240 may include an additional gate dielectric layer. For example, the dummy gate stack 240 may include silicon oxide. Alternatively or additionally, the gate dielectric layer of the dummy gate stack 240 may include silicon nitride, a high-K dielectric material or other suitable material. In some embodiments, the electrode layer 244 may include polycrystalline silicon (polysilicon). In some embodiments, the gate hard mask 246 includes an oxide layer 247 such as a pad oxide layer that may include silicon oxide. In some embodiments, the gate hard mask 246 includes the nitride layer 248 such as a pad nitride layer that may include silicon nitride ($Si_3N_4$), silicon oxynitride and/or silicon carbide.

Figure 3A:
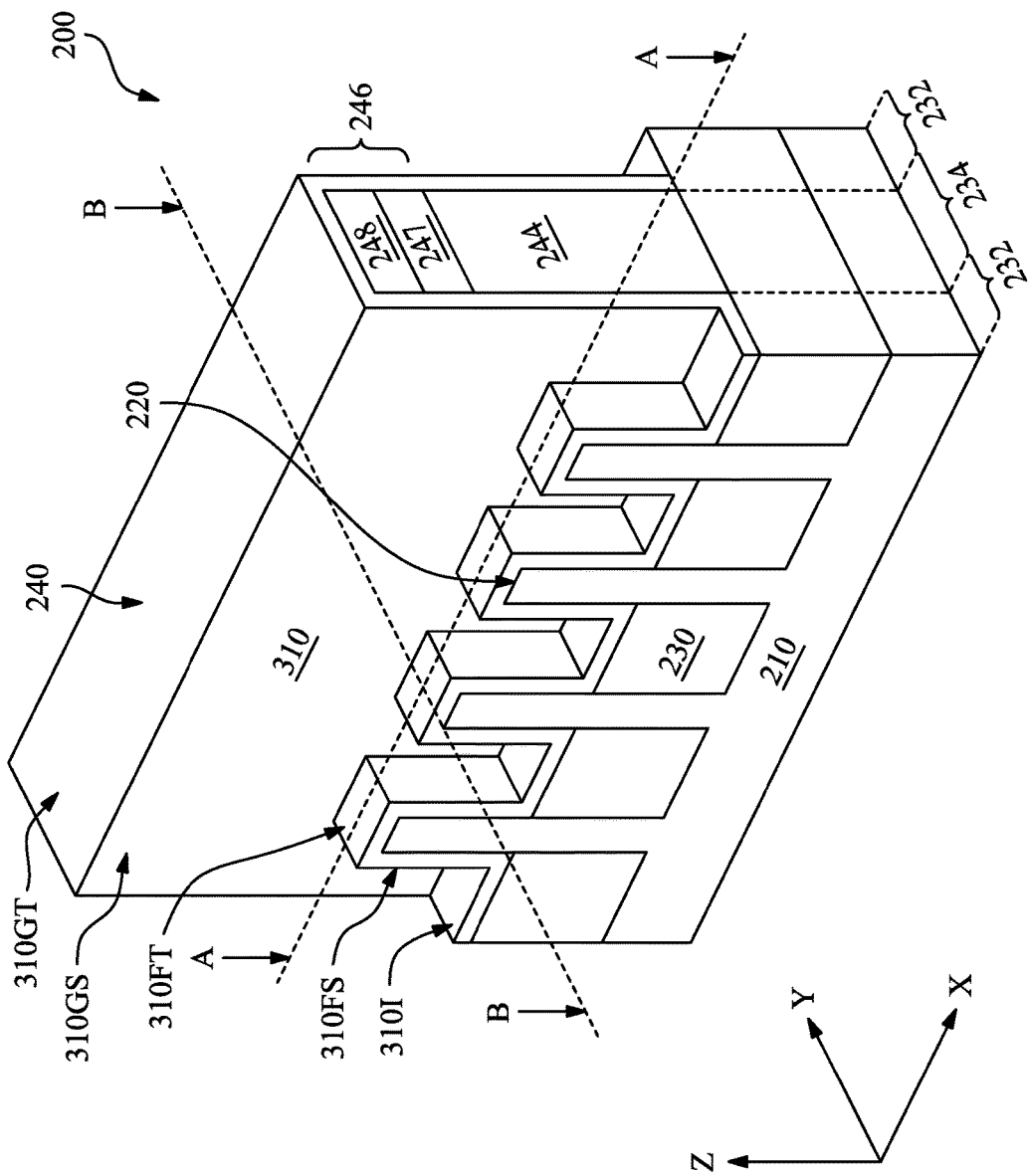
FIG. 3A is a diagrammatic perspective view of an example semiconductor device in accordance with some embodiments.
Figure 3B:
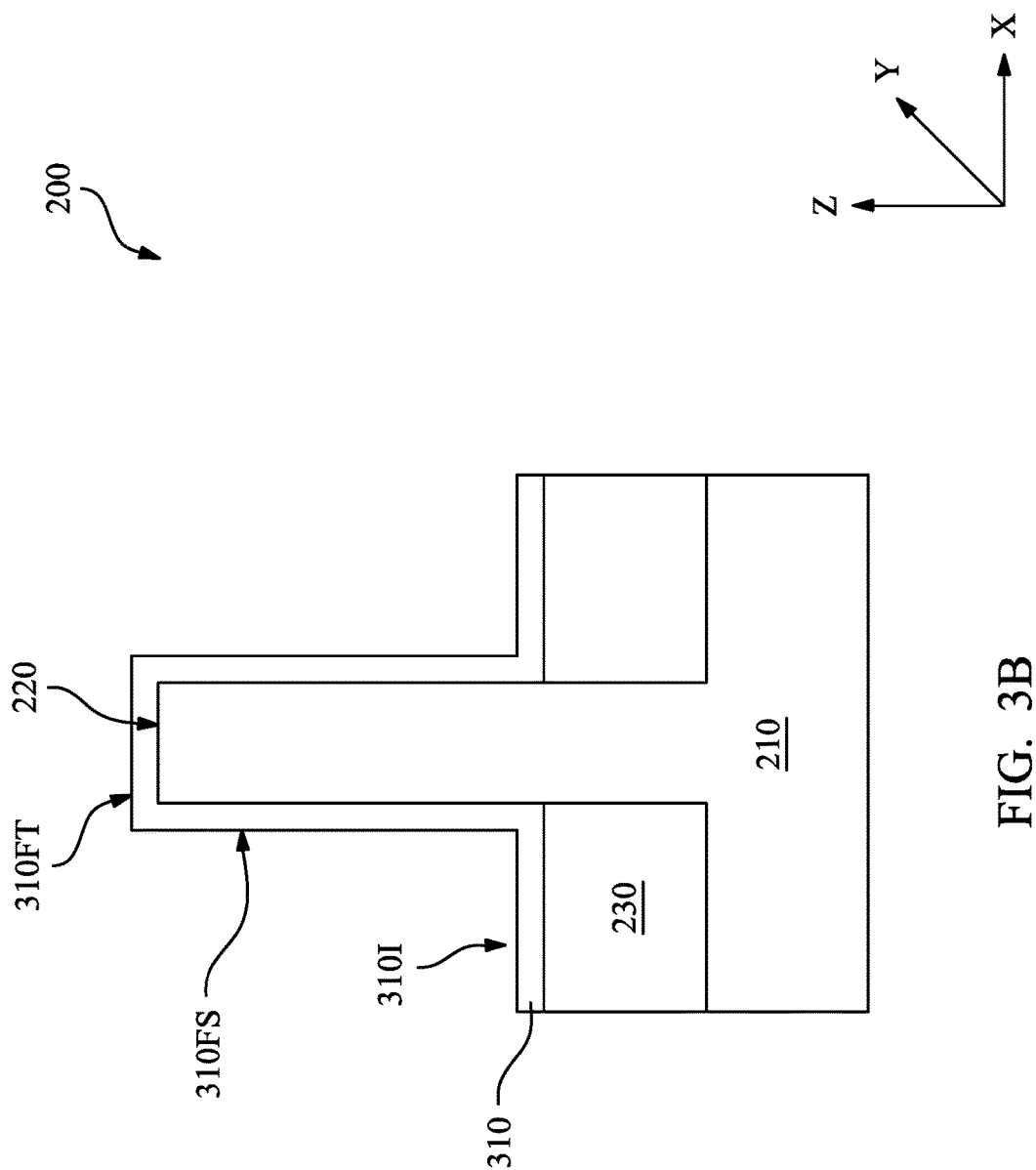
FIG. 3B is a cross section view of an example device in accordance with some embodiments, along the line A-A in FIG. 3A.
Figure 3C:
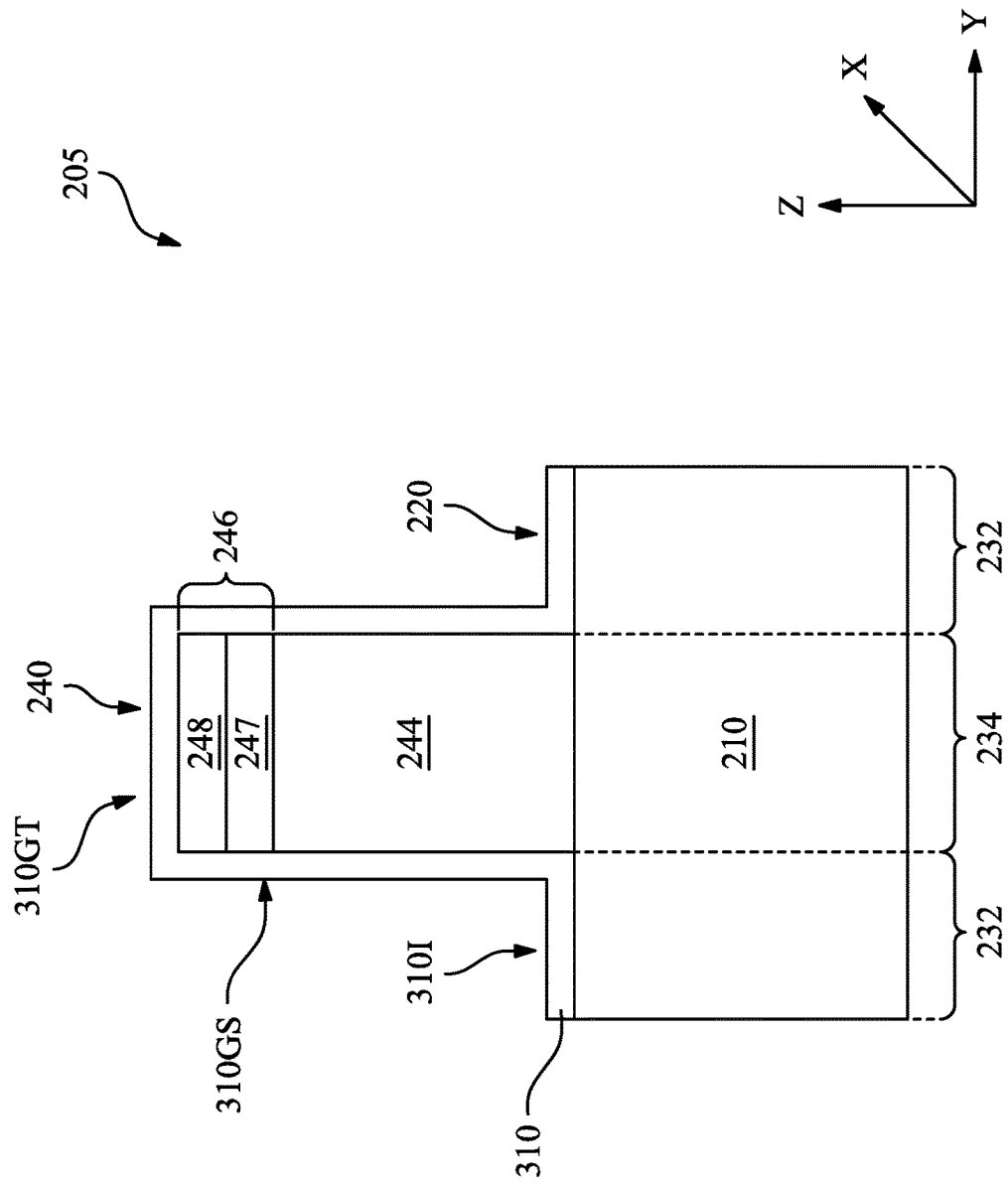
FIG. 3C is cross section view of an example device in accordance with some embodiments, along the line B-B in FIG. 3A.

Referring to FIGS. 1, 3A and 3B, once the initial structure 205 is received, the method 100 proceeds to step 104 by forming a spacer layer 310 over the substrate 210. The spacer layer 310 may be a conformal dielectric layer formed over both of the S/D region 232 and the gate region 234. The spacer layer 310 may form spacer elements on the sidewalls of the dummy gate stack 240. The spacer layer 310 may include a dielectric material such as silicon oxide, silicon nitride, silicon carbide, silicon oxynitride, SiCN films, silicon oxycarbide, SiOCN films, and/or combinations thereof. In some embodiments, the spacer layer 310 includes multiple layers, such as main spacer walls, liner layers, and the like. The spacer layer 310 may be formed by CVD, subatmospheric CVD (SACVD), flowable CVD, ALD, PVD, and/or other suitable process.

As a result, the spacer layer 310 wraps over fin features 220 in the S/D region 232 such that it is along sidewalls of the fin features 220 (identified as spacer layer portion 310FS), on top of fin features 220 (identified as spacer layer portion 310FT) and over the isolation feature 230 (identified as spacer layer portion 310I). Additionally, the spacer layer 310 wraps over the dummy gate stack 240 in the gate region 234 such than it is along sidewalls of the dummy gate stack 240 (identified as spacer layer portion 310GS) and on top of dummy gate stack 240 (identified as spacer layer portion 310GT). It is noted that the spacer layer portion 310FS is along YZ plane, the spacer layer portion 310GS is along XZ plane, which is substantially perpendicular to YZ plane. Spacer layer portions 310FT, 310GT and 310I, are along XY plane.

Typically, the spacer layer portions 310FS and 310FT are designed to be removed to expose the fin feature 220 for a subsequent S/D feature formation over the fin feature 220 in the S/D region 232, which provides several device performance benefits, such as increasing S/D volume to enhance S/D stress effect for channel mobility boost. It is a challenge to remove the spacer layer portion 310FS and 310FT without substantially etching the spacer layer portion 310GS, which will be a gate spacer, especially when the spacer layer portions, 310FS, 310FT and 310GS, are formed by a same spacer layer for process. Loss or partial loss thickness of the gate spacer may lead to exposing some portions of the gate stack 240 and result growing epitaxial mushroom defect on the gate stack 240 during a subsequent S/D formation. To address this issue, the present application provide methods for removing the spacer layer 310 along sidewalls of the fin feature 220 in the S/D region 232 without substantially etching the spacer layer 310 along sidewalls of the gate stack 240 in the gate region 234.

Figure 4A:
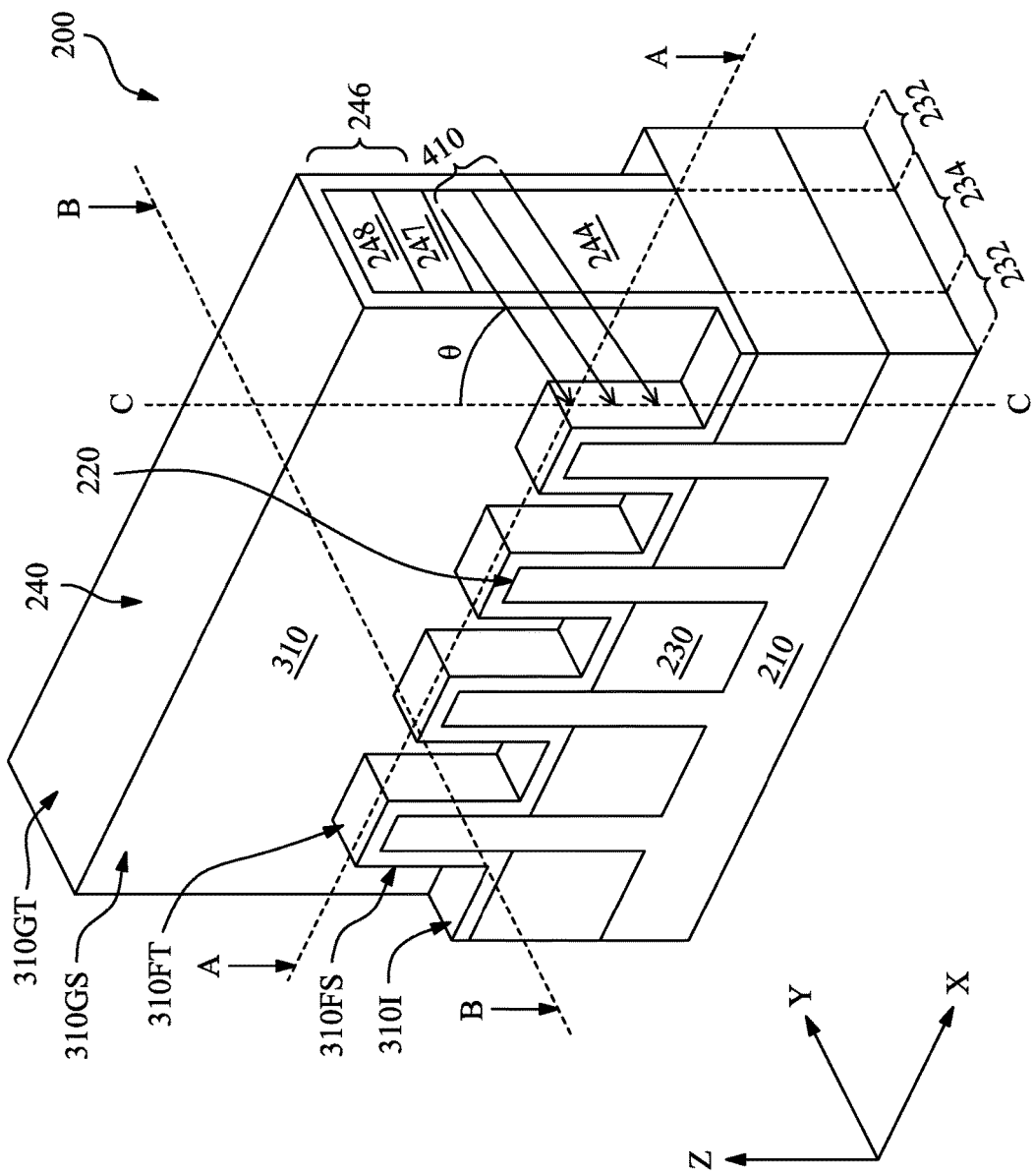
FIG. 4A is a diagrammatic perspective view of an example semiconductor device in accordance with some embodiments.
Figure 4C:
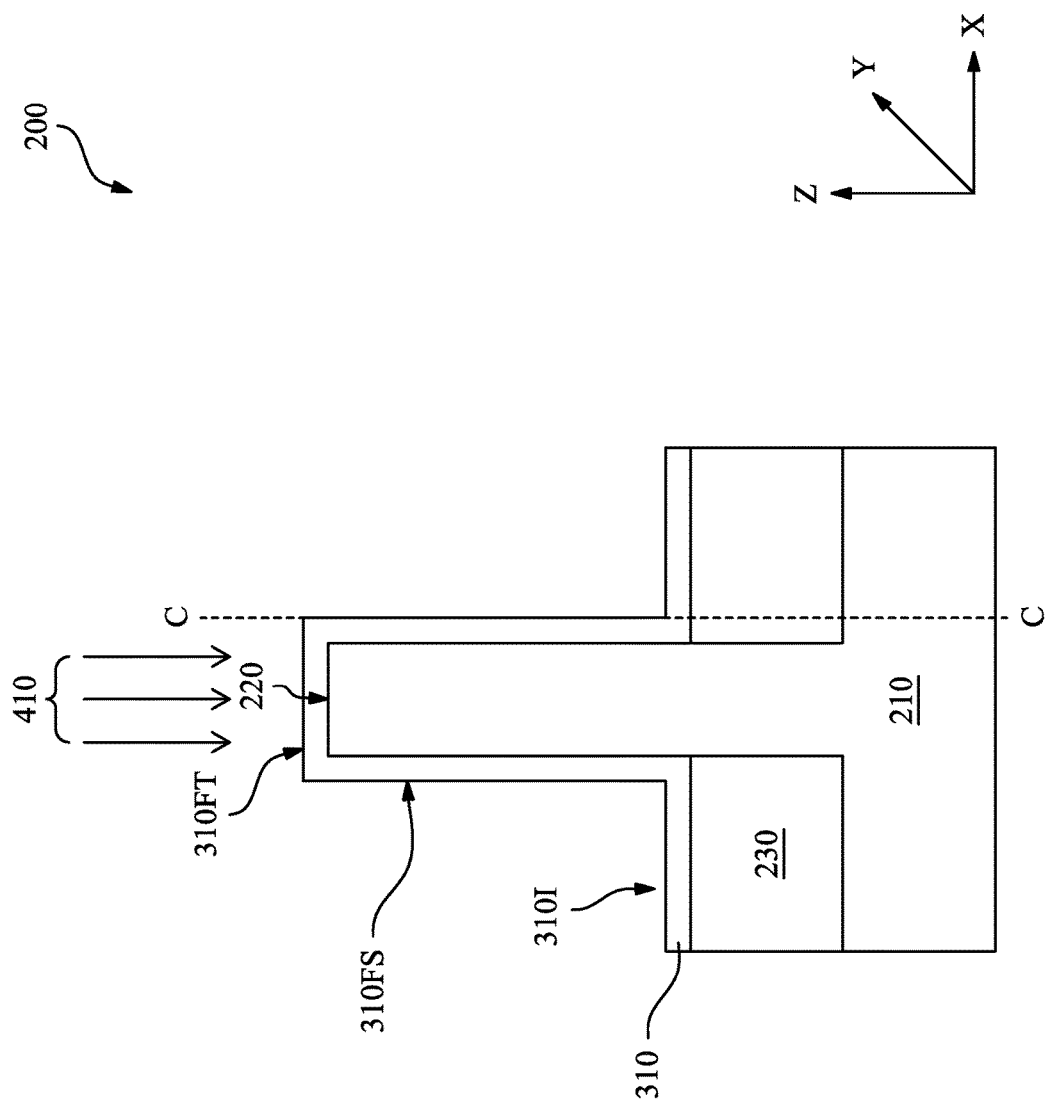
Figure 4D:
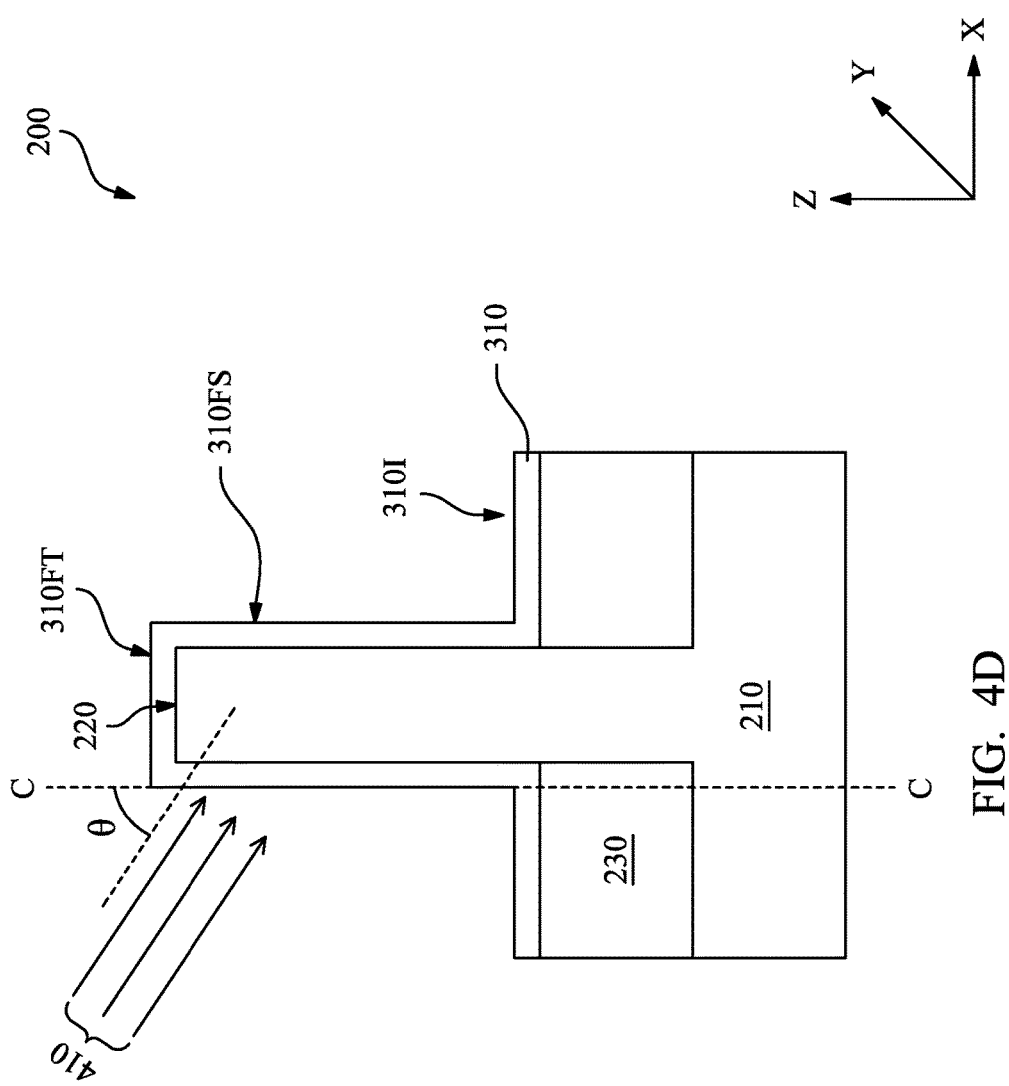

Referring to FIGS. 1, 4A, 4B and 4C, method 100 proceeds to step 106 by performing an angle-plasma etch to remove the spacer layer portions 310FS, 310FT and 310I without substantially etching the spacer layer portion 310GS. The spacer layer portion 310GT is etched as well. In the angle-plasma etch process, a high-speed stream of glow discharge (plasma) of an appropriate gas mixture, a plasma flux 410, is directed toward the substrate 210 at an angle of incidence θ with respect to a normal line C-C of the XY plane. In the present embodiment, the plasma flux 410 is directed such that it is parallel with the plane where the spacer layer portion 310GS disposed (the XZ plane) and therefore it does not substantially etch the spacer layer portion 310GS. During the angle plasma etch process, the angle of incidence θ is controlled to change in a range form − A degree to + A degree with respect to a center where θ is equal to zero, here the symbol "−" and the symbol "+" represent two opposite directions with respect to the center. As an example, the angle of incidence θ changes in a range from −45 degree to +45 degree. In some embodiments, the angle-plasma etch process may include three steps: the first step is angle-plasma etch process with the angle of incidence θ such that the plasma flux 410 is toward the right side of the spacer layer portion 310FS (as shown in FIG. 4B), the second step is another angle-plasma etch process with a zero angle of incidence θ (as shown in FIG. 4C) such that the plasma flux 410 is toward spacer layer portions, 310GT and 310I, and the third step is angle-plasma etch process with the angle of incidence θ such that the plasma flux 410 is toward the left side of the spacer layer portion 310FS (as shown in FIG. 4D).

Figure 4F:
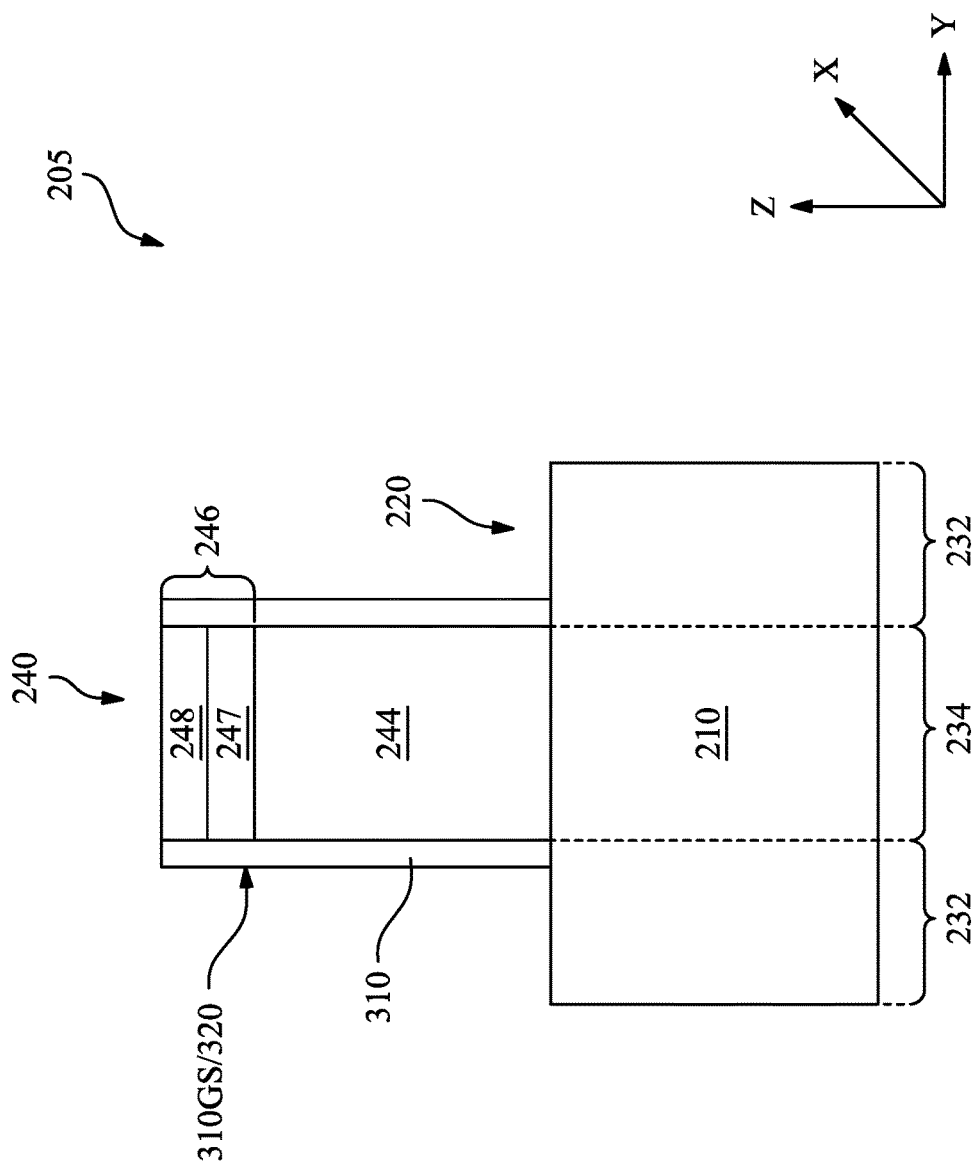
FIG. 4F is cross section view of an example device in accordance with some embodiments, along the line B-B in FIG. 4A.
Figure 4G:
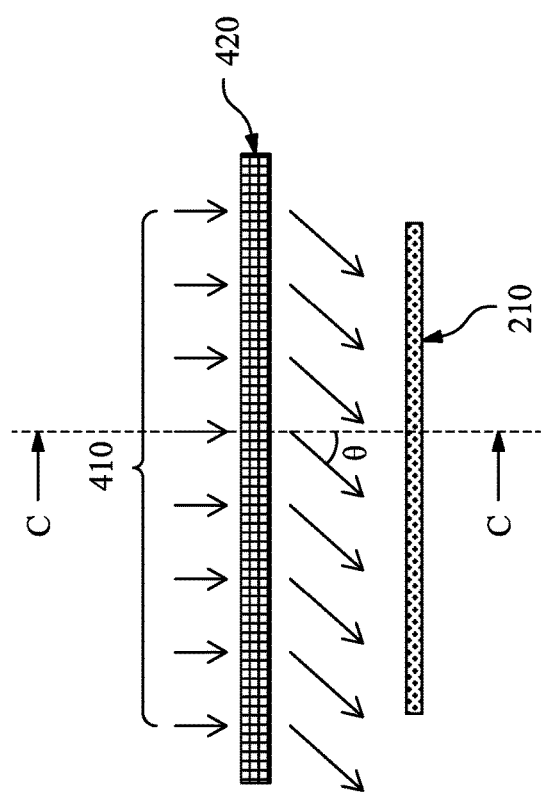
FIGS. 4G and 4H are diagrammatic perspective views of an example etching process in accordance with some embodiments.
Figure 4H:
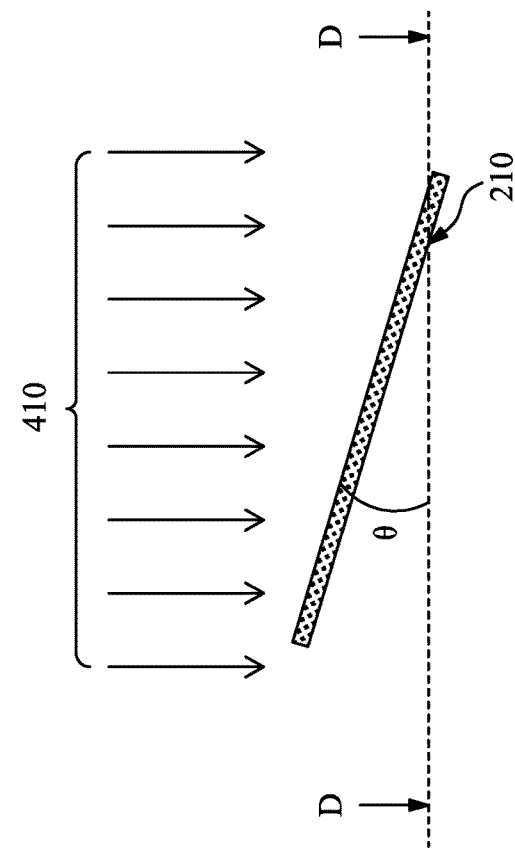

In some embodiments, the angle of incidence θ is induced by deflecting the plasma flux 410 by using a deflecting mechanism 420, as shown in FIG. 4G. The deflecting mechanism 420 may include a collimator, a magnetic field, an electric field, and/or a combination thereof. Alternatively, the angle of incidence θ is induced by tilting the substrate 210 from a line D-D by the angle of incidence θ, here the line D-D is perpendicular to a direction of the plasma flux 410, shown in FIG. 4H.

The angle plasma etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof.

As a result, the spacer layer portions, 310FS, 310FT, 310GT and 310I, are removed while the spacer layer portion 310GS remains intact, as shown in FIGS. 4E and 4F. In other words, the fins 220 in the S/D region 232 are exposed while the spacer layer portion 310GS remains intact along sidewalls of the dummy gate stack 240, which is referred to as a gate spacer 320.

Additional steps can be provided before, during, and after the method 100, and some of the steps described can be replaced, eliminated, or moved around for additional embodiments of the method 100.

Figure 5:
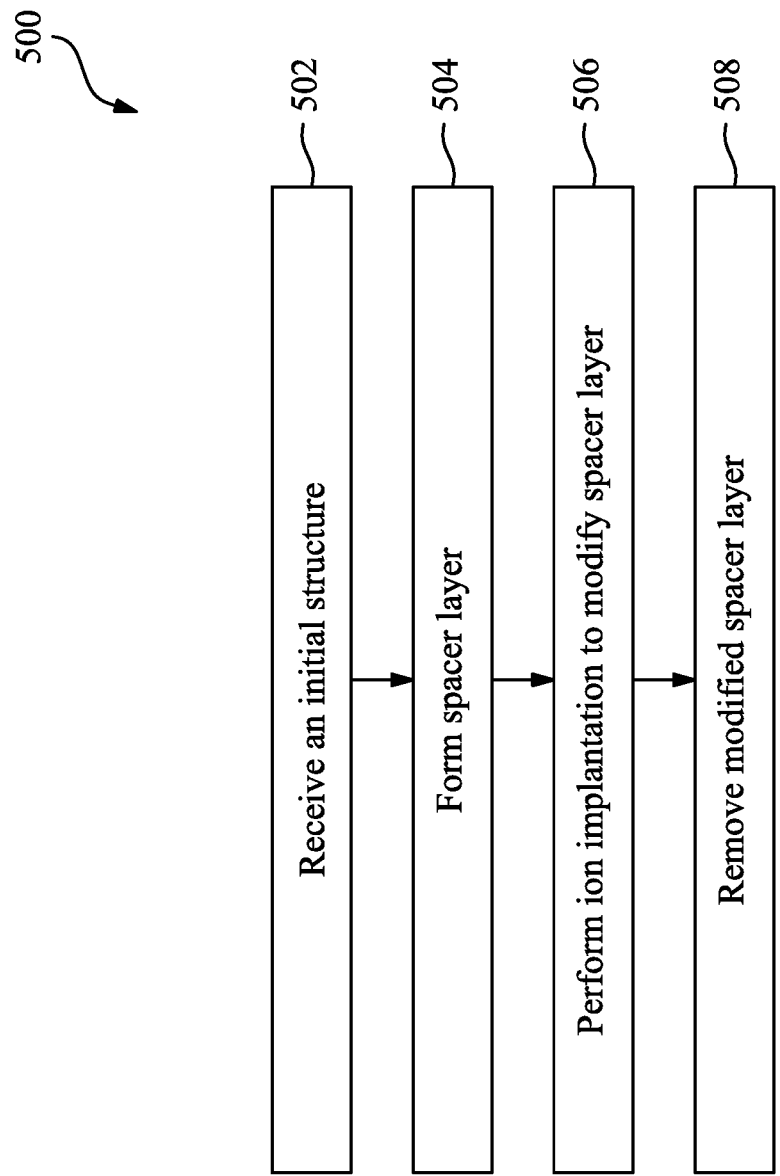
FIG. 5 is a flowchart of another example method for fabricating a semiconductor device constructed in accordance with some embodiments.

FIG. 5 is a flowchart of another example method 500 for fabricating the device 200. The steps 502 and 504 are similar to those discussed above in steps 102 and 104 of method 100. Thus, the discussion above with respect to steps 102 and 104 is applicable to the steps 502 and 504, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 5, 6A, 6B and 6C, method 400 proceeds to step 506 by performing an ion implantation to modify the spacer layer portions, 310FS, 310FT and 310I, into a modified spacer layer portions 1250FS, 1250FT and 1250I, respectively, while the spacer layer portion 310GS remains intact. The spacer layer portion 310GT is modified as well, referred to as modified spacer layer portion 1250GT. The ion implantation process introduces ion species into the spacer layer portions, 310FS, 310FT, 310GT and 310I, that increases the etching rate of them when compared to the spacer layer portion 310GS in a subsequent etch discussed below. In an embodiment, the ion implantation with nitrogen species is applied to modify the spacer layer portions, 310FS, 310FT, 310GT and 310I. Alternatively, the implantation may include species such as oxygen, fluorine, boron, and/or other species.

Figure 6A:
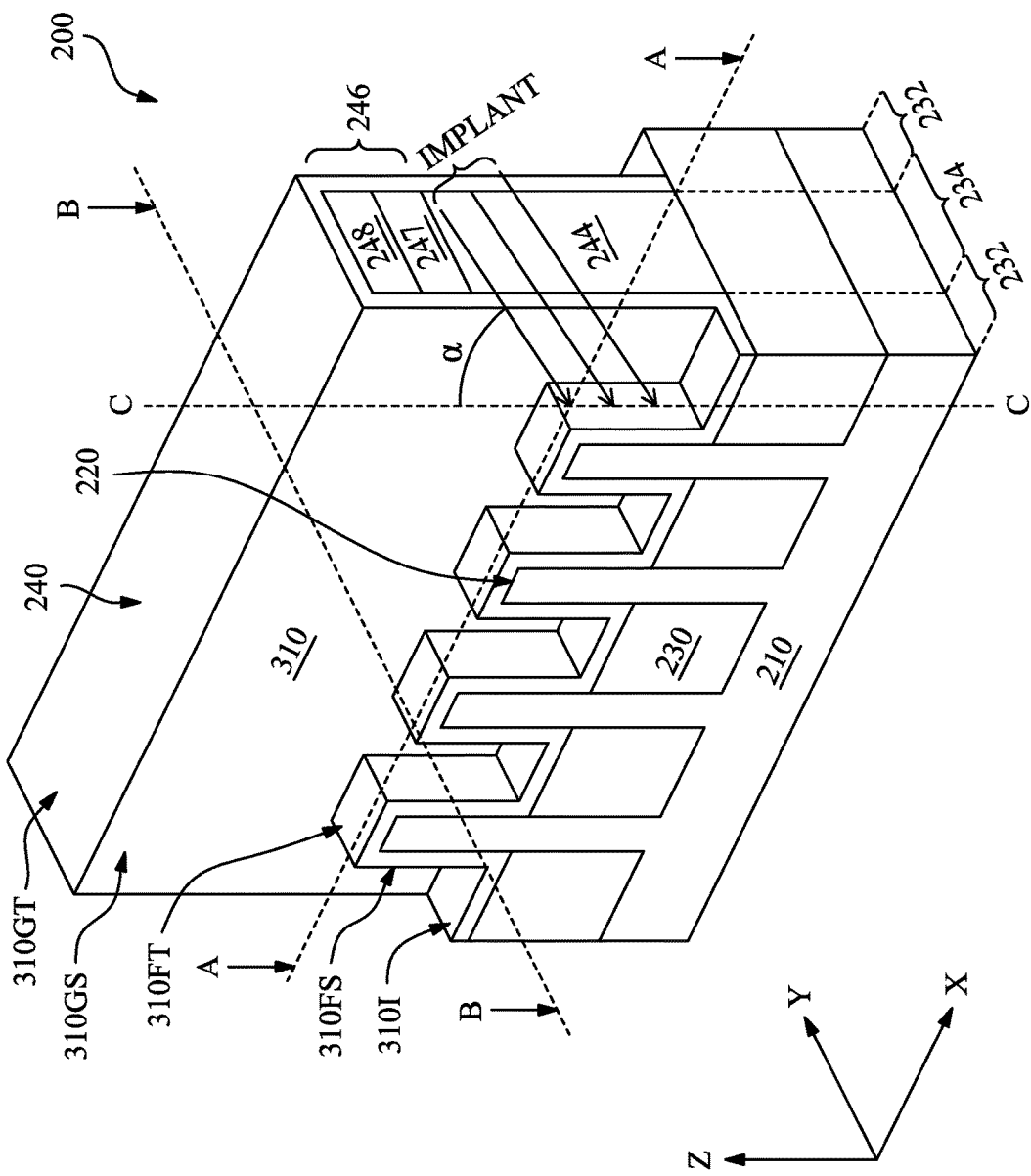
FIG. 6A is a diagrammatic perspective view of an example semiconductor device in accordance with some embodiments.
Figure 6B:
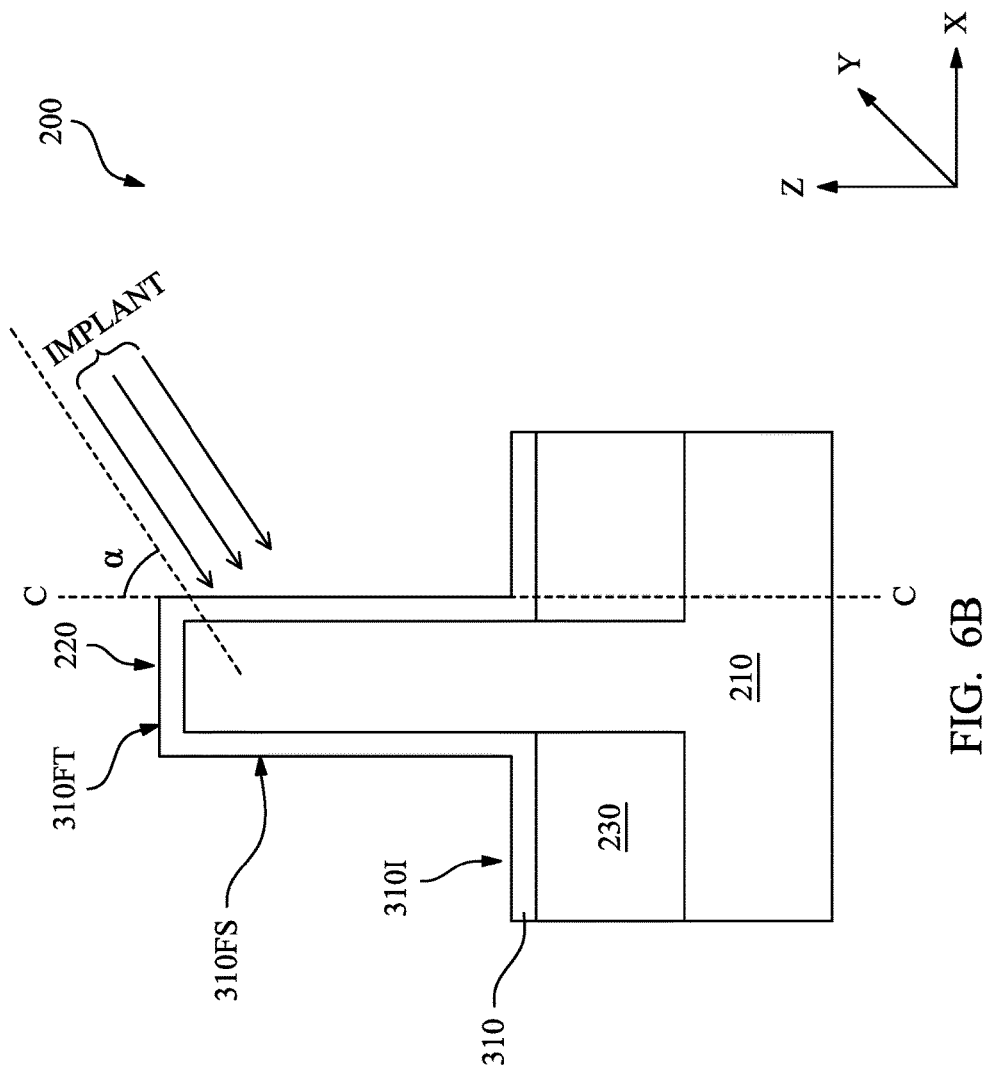
FIGS. 6B, 6C, 6D and 6E are cross section views of an example device in accordance with some embodiments, along the line A-A in FIG. 6A.
Figure 6C:
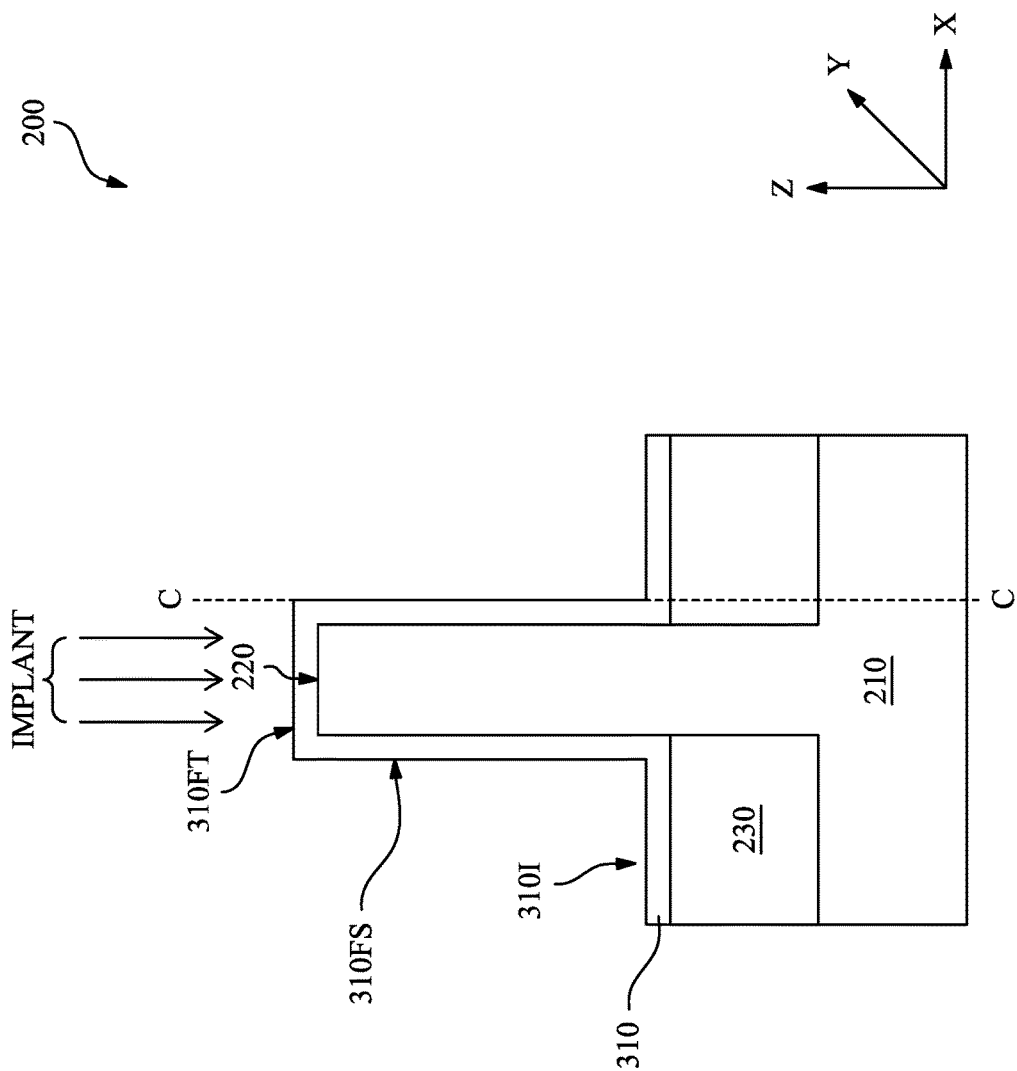
Figure 6D:
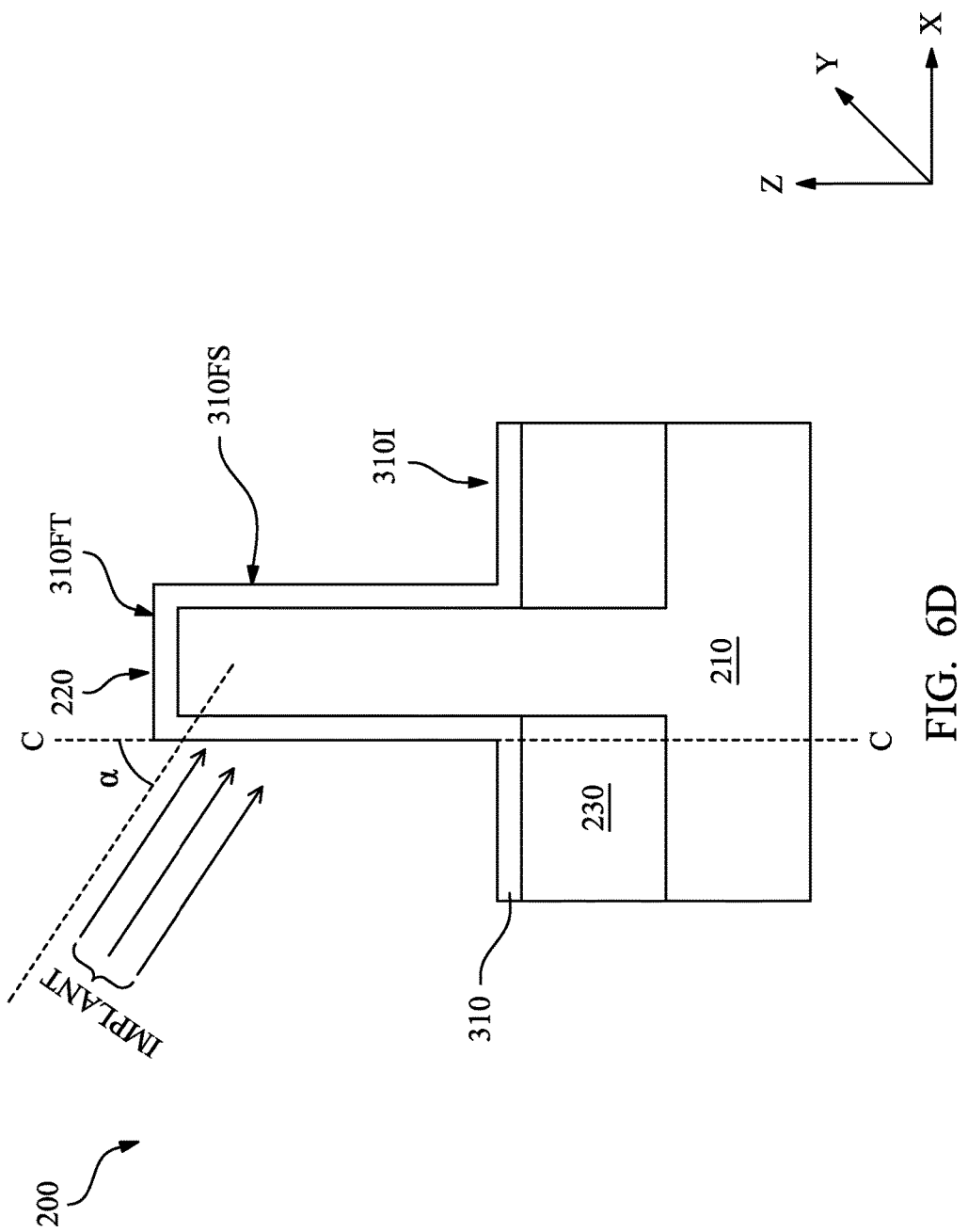
Figure 6E:
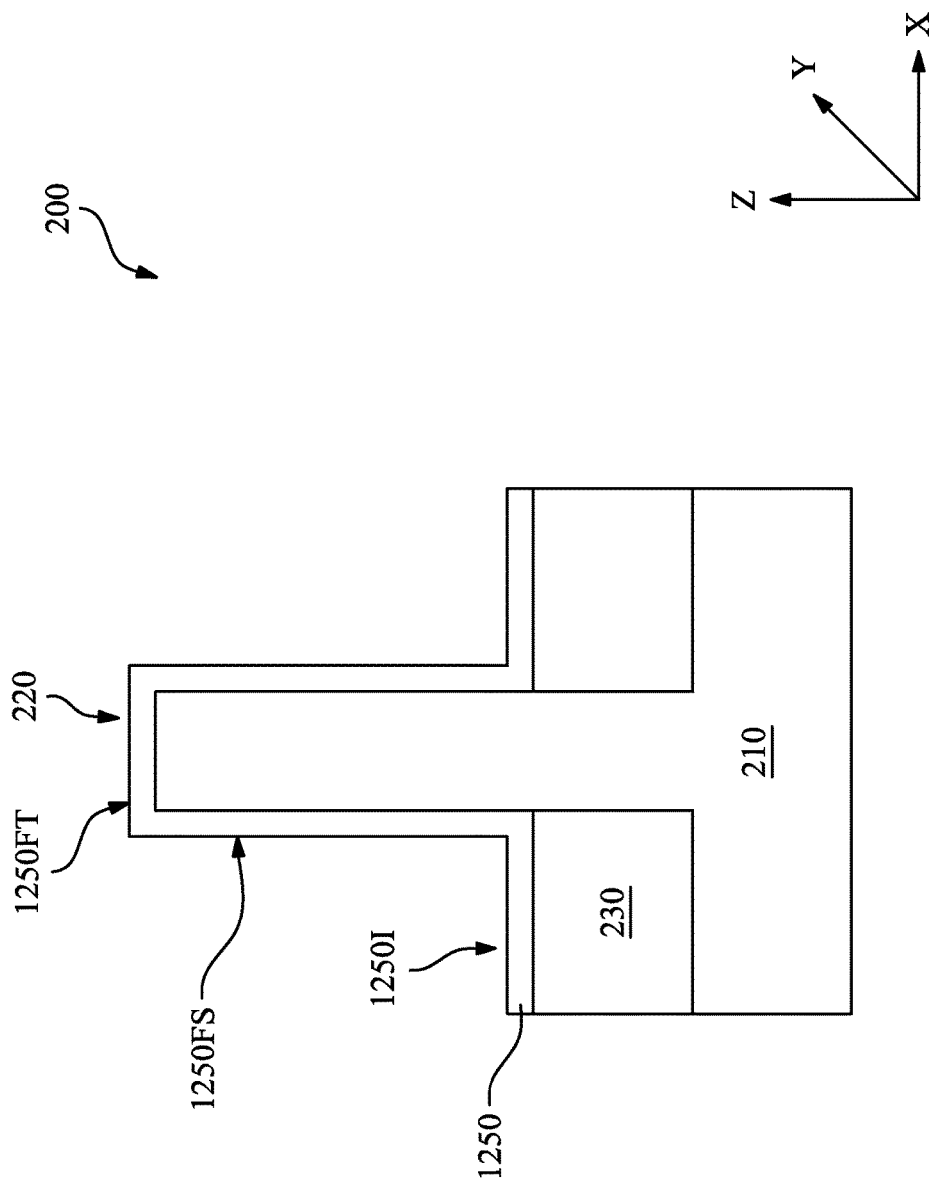
Figure 6F:
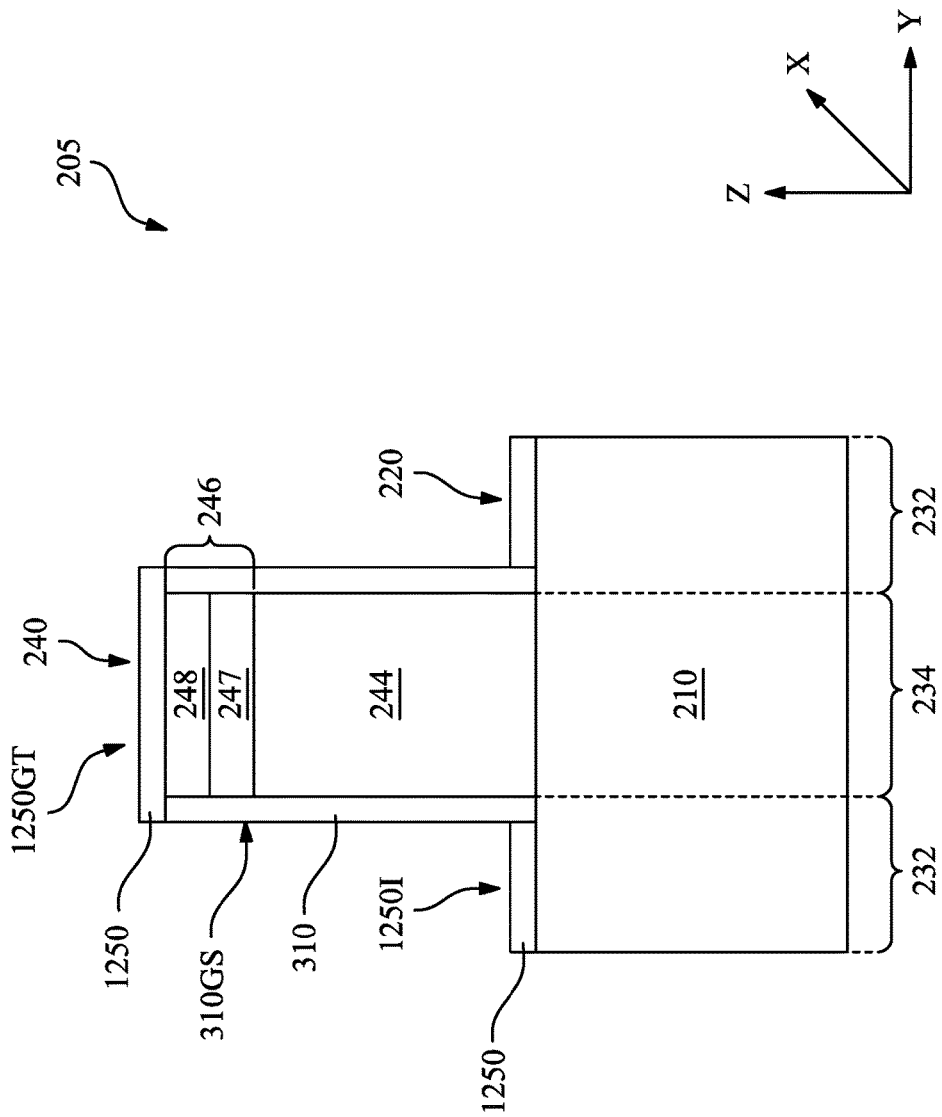
FIG. 6F is cross section view of an example device in accordance with some embodiments, along the line B-B in FIG. 6A.

In the present embodiment, a flux of ion species of the ion implantation is directed to be parallel with the plane XZ, where the spacer layer portion 310GS disposed, and therefore it does not modify the spacer layer portion 310GS. In some embodiments, the implantation is a tilted ion implantation having a tilt angle α with respect to the normal line C-C of the XY plane. The tilt angle α ranges from 0 degree (to normal line C-C) to about 90 degrees (on both sides of the normal line C-C). The tilt angle α of the ion implantation is designed such that the spacer layer portions, 310FS, 310FT, 310GT and 310I, are modified. In some embodiments, the ion implantation process may include three steps: the first step is an ion implantation with a tilt angle α such that the ion beam is toward the right side of the spacer layer portion 310FS (as shown in FIG. 6B), the second step is another ion implantation with a zero tilt angle α (as shown in FIG. 6C) such that the ion beam is toward spacer layer portions, 310GT and 310I, and the third step is an ion implantation with the tilt angle α such that the ion beam is toward the left side of the spacer layer portion 310FS (as shown in FIG. 6D).

Figure 7B:
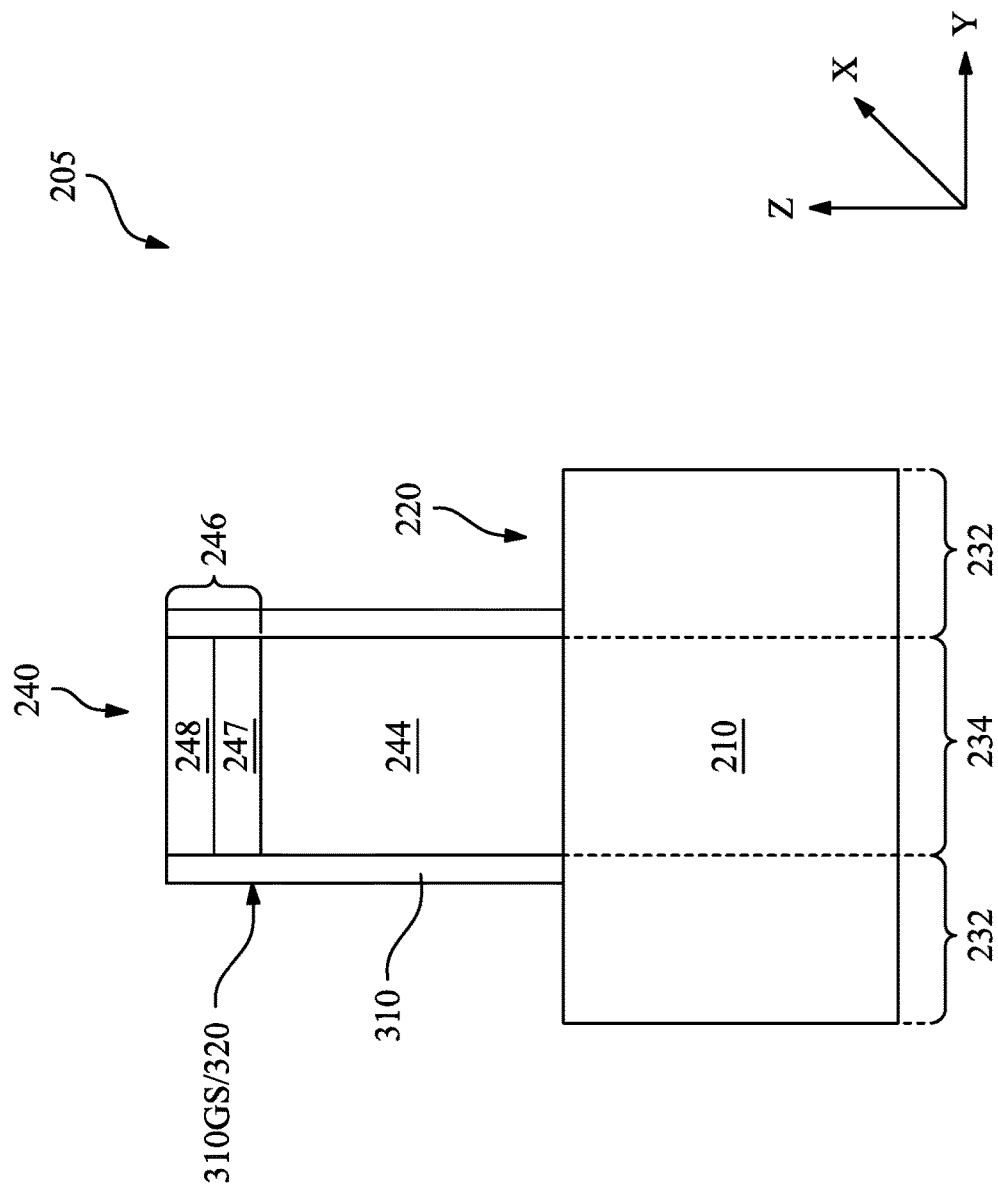
FIG. 7B is cross section view of an example device in accordance with some embodiments, along the line B-B in FIG. 6A.

Referring to FIGS. 5, 7A and 7B, method 500 proceeds to step 508 by removing the modified spacer layer portions 1250FS, 1250FT, 1250I, and 1250GT. As has been mentioned previously, in the present embodiment, the modified spacer layer portions 1250FS, 1250FT, 1250I, and 1250GT have a substantially different etch selectivity as compared to the spacer layer portion 310GS. Thus, the modified spacer layer portions 1250FS, 1250FT, 1250I, and 1250GT are removed without substantially etching the spacer layer portion 310GS. In an embodiment, the etch process is a wet etch with corresponding etchant that may include phosphoric acid ($H_3PO_4$), ammonium hydroxide ($NH_4OH$), hydrofluoric acid (HF), diluted HF solution, Hydrochloric acid (HCL), and/or other suitable wet etching solutions, and/or combinations thereof Additional steps can be provided before, during, and after the methods, 100 and 500, and some of the steps described can be replaced, eliminated, or moved around for additional embodiments of the methods, 100 and 500. For example, after the fin features 220 are exposed in the S/D region 232, S/D features are formed over the exposed fin features 220, separated by the dummy gate stack 240 (including sidewall spacers 320). The S/D features may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. In some embodiments, a portion of the fin 220 is recessed to form S/D recesses and then the S/D features are formed over the S/D recesses by epitaxial growing processes, such as CVD, VPE and/or UHV-CVD, molecular beam epitaxy, and/or other suitable processes. One or more annealing processes may be performed to activate dopants. The annealing processes comprise rapid thermal annealing (RTA) and/or laser annealing processes.

For another example, after forming S/D features, the dummy gate stack 240 is replaced by a high-k/metal gate (HK/MG). In some embodiments, the dummy gate stack 240 is removed first to form a gate trench and a portion of the fin feature 220 is exposed within the gate trench. The etch process may include a selective wet etch, a selective dry etch, and/or a combination thereof. Then the HK/MG is formed over the gate trench, including wrapping over the exposed fin feature 220. The HK/MG may include a HK dielectric layer and a MG electrode. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG electrode may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The HK/MG may be formed by a process such as CVD, PVD, ALD, and/or other techniques.

The semiconductor device 200 may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of removing a spacer layer portion to expose fin features in a S/D region without substantially etching the spacer layer portion along sidewalls of a gate stack. The method employs angle-plasma etch to selectively remove the spacer layer portion over the fin feature in the S/D region. The method also employs modifying etch selectivity of the spacer layer portion over the fin feature to achieve a selective etch to remove the modified spacer layer portion over the fin feature in the S/D region.

The present disclosure provides many different embodiments of fabricating a semiconductor device that provide one or more improvements over existing approaches. In one embodiment, a method for fabricating a semiconductor device includes forming a fin feature over a substrate having a first region and a second region, forming a gate stack over the fin feature in the first region and forming a spacer layer over the gate stack in the first region and over the fin feature in the second region. The spacer layer is disposed along sidewalls of the gate stack and the fin feature, respectively. The method also includes removing the spacer layer along sidewalls of the fin feature in the second region without removing the spacer layer along sidewalls of the gate stack in the first region.

In yet another embodiment, a method includes forming a fin feature over a substrate having a first region and a second region, forming a gate stack over the fin feature in the first region and forming a spacer layer over the gate stack in the first region and over the fin feature in the second region. The spacer layer is disposed along sidewalls of the gate stack and the fin feature. The method also includes applying an angle-plasma etch to remove the spacer layer along sidewalls of the fin feature in the second region without removing the spacer layer along sidewalls of the gate stack in the first region.

In yet another embodiment, the method includes forming a fin feature over a substrate having a first region and a second region, forming a gate stack over the fin feature in the first region and forming a spacer layer over the gate stack in the first region and over the fin feature in the second region. The spacer layer is disposed along sidewalls of the gate stack and the fin feature. The method also includes modifying the spacer layer along sidewalls of the fin feature in the second region to have different etch selectivity than the spacer layer along sidewalls of the gate stack in the first region. The method also includes selectively removing the modified spacer layer along sidewalls of the fin feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin feature over a substrate having a first region and a second region;
   forming a gate stack over the fin feature in the first region;
   forming a spacer layer over the gate stack in the first region and over the fin feature in the second region, wherein the spacer layer is disposed over along sidewalls of the gate stack and the fin feature, respectively; and
   removing, by an etching process, the spacer layer along sidewalls of the fin feature in the second region without removing the spacer layer along sidewalls of the gate stack in the first region, wherein removing the spacer layer along sidewalls of the fin feature in the second region includes tilting the substrate during the etching process.

2. The method of claim 1, wherein removing the spacer layer along sidewalls of the fin feature in the second region is removed by an angle-plasma etch.

3. The method of claim 2, wherein a plasma flux of the angle-plasma etch is directed such that it is parallel with a plane of the sidewalls of the gate stack in the first region.

4. The method of claim 1, wherein removing the spacer layer along sidewalls of the fin feature in the second region without removing the spacer layer along sidewalls of the gate stack includes:
   modifying the spacer layer along sidewalls of the fin feature in the second region; and
   selectively etching the modified spacer layer.

5. The method of claim 4, wherein modifying the spacer layer along sidewalls of the fin feature in the second region includes performing an ion implantation process on the sidewalls of the fin feature in the second region.

6. The method of claim 5, wherein the ion implantation is directed to be parallel with a plane of the sidewalls of the gate stack in the first region.

7. The method of claim 5, wherein the ion implantation includes a tilted ion implantation.

8. The method of claim 1, wherein forming the spacer layer over the gate stack in the first region and over the fin feature in the second region includes:
   forming the spacer layer over a top surface of the fin feature and a top surface of the gate stack, respectively.

9. The method of claim 8, wherein removing the spacer layer along sidewalls of the fin feature in the second region includes removing the spacer layer over the top surfaces of the fin feature and the gate stack.

10. A method comprising:
    forming a fin feature over a substrate having a first region and a second region;
    forming a gate stack over the fin feature in the first region;
    forming a spacer layer over the gate stack in the first region and over the fin feature in the second region, wherein the spacer layer is disposed along sidewalls of the gate stack and the fin feature; and
    applying an angle-plasma etch to remove the spacer layer along sidewalls of the fin feature in the second region without removing the spacer layer along sidewalls of the gate stack in the first region, wherein applying the angle-plasma etch to remove the spacer layer along sidewalls of the fin feature in the second region without removing the spacer layer along sidewalls of the gate stack in the first region includes tilting the substrate during the applying of the angle-plasma etch.

11. The method of claim 10, wherein applying the angle-plasma etch to remove the spacer layer along sidewalls of the fin feature in the second region includes directing a plasma flux of the angle-plasma etch such that it is parallel with a plane of the sidewalls of the gate stack in the first region.

12. The method of claim 10, wherein forming the spacer layer over the gate stack in the first region and over the fin feature in the second region includes forming the spacer layer over a top surface of the fin feature and a top surface of the gate stack.

13. The method of claim 12, wherein applying the angle-plasma etch to remove the spacer layer along sidewalls of the fin feature in the second region includes removing the spacer layer over the top surfaces of the fin feature and the gate stack.

14. A method comprising:
    forming a fin feature over a substrate having a first region and a second region, the fin feature formed of a semiconductor material;
    forming a gate stack over the fin feature in the first region;
    forming a spacer layer over the gate stack in the first region and directly on the fin feature in the second region, wherein the spacer layer is disposed along sidewalls of the gate stack and the fin feature and directly on a top surface of the fin feature such that the spacer layer physically contacts the top surface of the fin feature, the top surface facing away from the substrate and being formed of the semiconductor material;
    modifying the spacer layer along sidewalls of the fin feature in the second region to have different etch selectivity than the spacer layer along sidewalls of the gate stack in the first region; and
    selectively removing the modified spacer layer along sidewalls of the fin feature.

15. The method of claim 14, wherein modifying the spacer layer along sidewalls of the fin feature in the second region includes performing an ion implantation on the spacer layer along sidewalls of the fin feature in the second region.

16. The method of claim 15, wherein the ion implantation is directed to be parallel with a plane of the sidewalls of the gate stack.

17. The method of claim 14, wherein the ion implantation includes a tilted ion implantation.

18. The method of claim 14, wherein forming the spacer layer over the gate stack in the first region and over the fin feature in the second region includes forming the spacer layer over a top surface of the fin feature and a top surface of the gate stack.

19. The method of claim 18, wherein modifying the spacer layer along sidewalls of the fin feature in the second region includes modifying the spacer layer over the top surfaces of the fin feature and the gate stack.

20. The method of claim 18, wherein selectively removing the modified spacer layer along sidewalls of the fin feature includes removing the modified spacer layer over the top surfaces of the fin feature and the gate stack.

* * * * *